United States Patent [19]
Bois

[11] Patent Number: 4,679,304
[45] Date of Patent: Jul. 14, 1987

[54] PROCESS FOR PRODUCING ZONES FOR THE ELECTRICAL ISOLATION OF THE COMPONENTS OF AN INTEGRATED CIRCUIT

[76] Inventor: Daniel Bois, Chet BD 98, 38263 Neylam, France

[21] Appl. No.: 800,617
[22] PCT Filed: Mar. 29, 1985
[86] PCT No.: PCT/FR85/00066
  § 371 Date: Nov. 15, 1985
  § 102(e) Date: Nov. 15, 1985
[87] PCT Pub. No.: WO85/04516
  PCT Pub. Date: Oct. 10, 1985

[30] Foreign Application Priority Data
Mar. 30, 1984 [FR] France ............... 84 05051

[51] Int. Cl.[4] .............. H01L 21/82; H01L 21/306
[52] U.S. Cl. .................. 29/576 W; 29/576 B; 29/576 E; 29/571; 148/1.5; 148/DIG. 82; 357/51
[58] Field of Search ........... 29/576 B, 576 W, 576 E, 29/571; 148/1.5; 357/51

[56] References Cited
U.S. PATENT DOCUMENTS
3,853,633  12/1974  Armstrong ............. 148/1.5
4,477,310  10/1984  Park et al. ............ 29/576 W
4,502,913  3/1985   Lechaton et al. ....... 29/576 W
4,506,435  3/1985   Pliskin et al. ........ 29/576 W
4,551,911  11/1985  Sasaki et al. ......... 29/576 W
4,584,763  4/1986   Jambotkar et al. ...... 29/578

FOREIGN PATENT DOCUMENTS
0072966  3/1983  European Pat. Off. .
0091507  10/1983 European Pat. Off. .

OTHER PUBLICATIONS
IBM Technical Disclosure Bulletin, vol. 25, No. 12, May, 1983, pp. 6611-6614, S. A. Abbas et al: "Simplified Isolation for an Integrated Circuit" *FIGS. 1-5*.

Primary Examiner—Upendra Roy
Attorney, Agent, or Firm—Oblon, Fisher, Spivak, McClelland & Maier

[57] ABSTRACT

This process consists of producing a mask on a silicon substrate for defining the locations of the isolation zones to be formed, doping the unmasked substrate regions, thermally oxidizing said substrate regions, forming a trench in each oxidized region of the substrate and in the regions of substrate located beneath said oxidized regions thermally oxidizing the edges of the trenches, filling the trenches with an isolating dielectric and eliminating the mask.

7 Claims, 5 Drawing Figures

PROCESS FOR PRODUCING ZONES FOR THE ELECTRICAL ISOLATION OF THE COMPONENTS OF AN INTEGRATED CIRCUIT

BACKGROUND OF THE INVENTION

The present invention relates to a process for the production of zones for the electrical isolation of the components of an integrated circuit. This process can be used in the field of microelectronics whenever it is necessary to electrically isolate or insulate individual components (transistors, diodes, etc.) formed on a conductive support. It therefore more particularly applies to integrated circuits using silicon as the substrate, such as bipolar or MOS integrated circuits.

The desire to obtain a high integration density in such integrated circuits makes it necessary to use a special dielectric isolation procedure in between the different components.

At present three major groups of isolation procedures using dielectrics are known.

In the first group, the isolation between the components is effected at the surface of the integrated circuits by producing isolation zones obtained by depositing an isolating material, generally silicon oxide. This procedure has mediocre isolation performances in view of the oxide quality deposited. Moreover, it leads to the formation of high steps on the integrated circuit board at the location of the isolation zones, which is prejudicial to obtaining a high integration density.

Furthermore, in order to prevent the formation of a parasitic conductor channel beneath the isolation zones, it is necessary to locally dope the corresponding underlying regions. However, in this isolation procedure, the doping cannot be carried out with the same mask as that used for defining the isolation zones so that it is not an autopositioned procedure. Therefore, it has been virtually abandoned in connection with the production of integrated circuits using silicon as the substrate.

In the second group, the isolation between the components is obtained by means of a silicon oxide formed by the local oxidation of the silicon substrate through a mask. Prior to the oxidation of the substrate, this mask is also used for defining the zones of the substrate in which doping is carried out for eliminating the possibility of the formation of a parasitic channel beneath the oxidised region. Thus, this is in fact an autopositioned procedure.

This procedure or technology known under the term LOCOS (local oxidation) technology is at present the standard isolating procedure in integrated circuits using silicon as the substrate. However, this technology requires the formation of isolation zones with a width of 4 to 7 $\mu$m, which considerably limits the integration density. Moreover, in the most recent variants of this isolation procedure, it is only possible to carry out isolation over a depth of 1 $\mu$m. In addition it is only possible to obtain isolation over such a depth by carrying out high temperature thermal oxidation, which suffers from disadvantages.

In the third group, isolation between the components is obtained by opening trenches in the substrate, which are then filled with an isolating material. This filling takes place by depositing the isolating agent over the entire surface of the integrated circuit followed by removing the excess material deposited outside the trenches. The excess isolating material can be removed either by chemical or plasma etching, or by lift-off. This isolation procedure has more particularly been described in an IEDM article 1982, pp 237 to 240 entitled Deep Trench Isolated CMOS Devices.

The procedure using trenches made it possible to reach considerable isolation depths of several $\mu$m, with a width not exceeding 1 micrometer. However, this procedure does not solve the key problem of the formation of parasitic channels beneath the isolation zones and on the edges of the trenches.

SUMMARY OF THE INVENTION

The present invention relates to a process for producing zones for the electrical isolation of the components of an integrated circuit making it possible to obviate the aforementioned disadvantages. This process based on the formation of trenches and local oxidation, makes it possible to prevent the formation of parasitic channels beneath the isolation zones, and on the edges of trenches, whilst retaining the main advantages of the corresponding procedure.

More specifically, the present invention relates to a process for the production of isolating zones making it possible to bring about electrical isolation between the components of an integrated circuit formed on a silicon substrate, wherein it comprises the stages of forming a mask on the substrate in order to define the locations of the isolation zones to be produced, doping the unmasked substrate regions, thermal oxidation of said substrate regions, formation of a trench in each oxidised region of the substrate and in the substrate regions positioned below said oxidised regions, thermal oxidation of the edges of the trenches, filling the trenches with an isolating dielectric on eliminating the mask.

In this process, the trenches filled with isolating agent make it possible to obtain deep isolations, whereas local thermal oxidation of the unmasked substrate regions makes it possible to obtain an isolation on the surface of the silicon substrate, as in the prior art LOCOS process. This isolation on the surface is due to the autopositioning (same mask) of the local oxidation and the doping of the unmasked regions of the substrate.

In the case where isolating material is located outside the trenches, according to the invention this has to be eliminated in particular by etching.

According to a preferred embodiment of the process according to the invention, doping of the unmasked substrate regions is carried out by ion implantation.

According to another preferred embodiment of the process according to the invention the trenches are filled by deposition e.g. using a chemical vapour phase deposition procedure.

Advantageously, the isolation dielectric is silicon oxide or polycrystalline silicon.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

In order to simplify the drawings, only one isolation zone has been shown.

Figure 1:
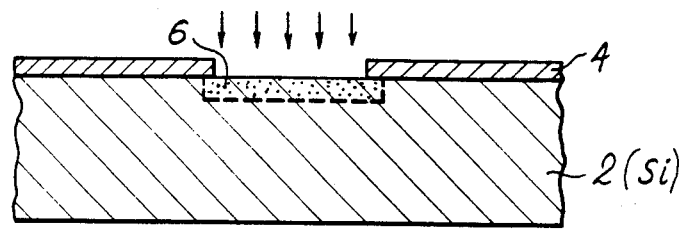
FIGS. 1 to 5 diagrammatically and in longitudinal section, the different stages of the process according to the invention.

On referring to FIG. 1, the first stage of the process according to the invention consists of producing a mask for, e.g. of silicon nitride ($Si_3N_4$) with a thickness of 2000 Å on an e.g. type p monocrystalline silicon substrate 2 of orientation 100 and conductivity between 20 and 40 Ω.cm. This mask 4 makes it possible to define the locations of the isolation zones to be formed, i.e. it makes it possible to mask the entire surface of the substrate, except at the locations where the isolation zones are to be located.

The following stage of the process consists of producing through mask 4 a doping of substrate 2 at the points where the isolation zones are provided. The doped regions of substrate carry reference 6. Doping can be carried out by ion implantation as indicated by the arrows, e.g. using boron ions with an energy of 50 KeV and with a dose of $10^{13}$ atoms/cm$^2$. This doping makes it possible to eliminate the possibility of a parasitic channel forming level with the isolation zones to be produced.

Figure 2:
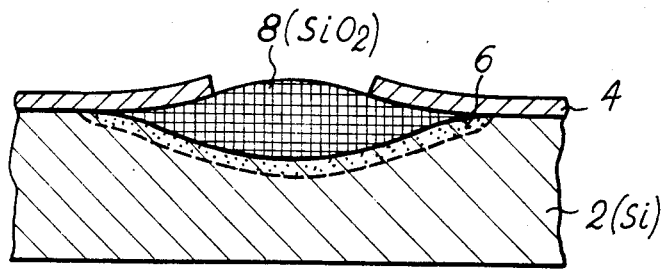

Following this doping, local thermal oxidation of the substrates takes place, i.e. an oxidation of the substrate region 6 doped through mask 4. This oxidation can be performed at 1000° C. for one hour and over a thickness of 3000 Å. As shown in FIG. 2, it permits the formation of isolating regions formed from silicon oxide, such as 8, as well as a re-distribution of the doping beneath these isolating regions 8. The latter make it possible to ensure surface isolation of the integrated circuit components.

Figure 3:
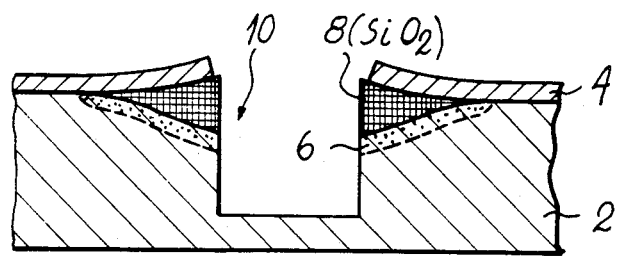

The following stage of the process consists of forming, in the manner shown in FIG. 3, trenches 10 in the oxidised regions 8 of the substrate, as well as in the substrate regions positioned below said oxidised regions. These trenches 10, which have a thickness and a depth of approximately 1 micrometer, can be obtained by etching through mask 4, e.g. with the said plasma, the oxidised zones 8 and the underlying substrate. This etching can in particular be carried out with a mixture of carbon tetrachloride ($CCl_4$) and oxygen.

Following etching, the edges of trenches 10 are thermally oxidised e.g. at a temperature of 950° C. for 1 hour.

Figure 4:
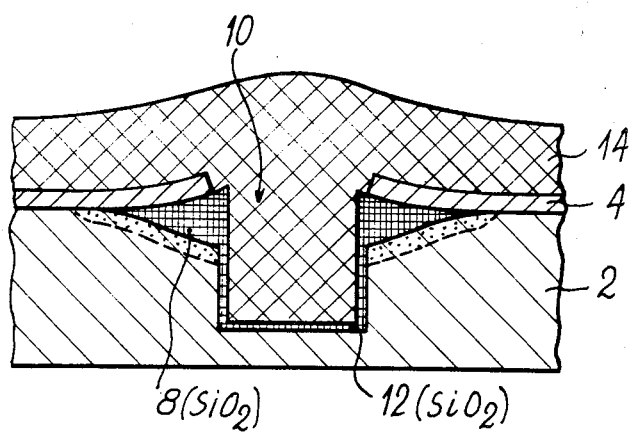
Figure 5:
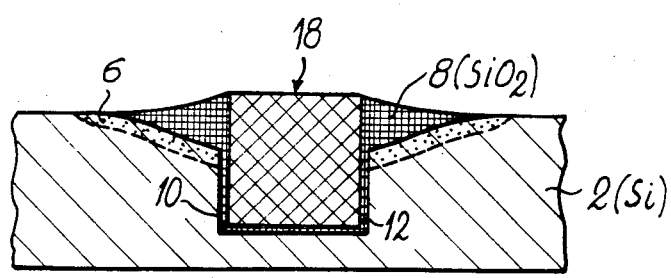

This oxidation makes it possible to obtain an oxide film 12, as shown in FIG. 4, which has a thickness of 1000 Å. This is followed by the filling of trenches 10 with an isolating dielectric 14, such as e.g. undoped polycrystalline silicon or silicon oxide. This filling of the trenches can be carried out by deposition and in particular by chemical vapour phase deposition at a temperature of approximately 600° C. The trenches 10 filled with isolating material make it possible to ensure a good depthwise and lateral isolation between the different components of the integrated circuits.

Then, as shown in FIG. 4, the excess isolating material 14 outside the trenches is eliminated, e.g. by a so-called planarisation process.

This process consists of depositing a layer of a resin, like those used in photolithography, on the isolating material 14 and etching both the latter and the resin by reactive etching, e.g. using a mixture of carbon trifluoride ($CHF_3$) and 10% by volume of oxygen with an exciting power of 100 W. The silicon nitride or silicon oxide mask 4 is then removed e.g. by chemical etching. When the mask is made from $Si_3N_4$, it can in particular be etched hot with the aid of phosphoric acid ($H_3PO_4$).

The use of the same mask 4 for carrying out the different oxidation and doping stages of the process permits an autopositioning of the isolation zones 18 and the doped regions 6 of the substrate. This autopositioning makes it possible to limit the dimensions of the isolation zones, which is very important in the case of integrated circuits having a high integration density.

The isolation zones 18, making it possible to electrically isolate the different components of an integrated circuit, are constituted by the remainder of the oxidised regions 8 of the substrate, after etching, the thin oxide film 12 formed on the edge of trench 10 and the isolating material 14 filling said trenches.

The process according to the invention makes it possible to obtain isolation zones 18 having lateral dimensions not exceeding 1 micrometer, but having a depth of several micrometers.

What is claimed is:

1. A process for the production of isolation zones for bringing about electrical isolation between the components of an integrated circuit formed on a silicon substrate, comprising the successive stages of:
   forming a mask on said substrate in order to define the locations of the isolation zones to be produced;
   doping the unmasked substrate regions;
   oxidizing thermally said doped substrate regions in order to form a surface isolation;
   forming a trench in each oxidized region of the substrate and in the substrate regions positioned below said oxidized regions by etching successively said oxidized regions and the substrate;
   oxidizing thermally the edges of said trenches in order to form on said edges an insulting film;
   filling said trenches by depositing an isolating dielectric in said trenches in order to form a deep isolation; and
   eliminating said mask.

2. The process of claim 1, wherein the excess isolation material outside said trench is eliminated.

3. The process of claim 1, wherein said doping is conducted by ion implantation.

4. The process of claim 1, wherein said isolating dielectric in said trench is silicon oxide or polycrystalline silicon.

5. The process of claim 1, wherein said mask is formed of $Si_3N_4$.

6. The process of claim 2, wherein said excess isolating dielectric material is removed by etching.

7. The process of claim 3, wherein said doping is achieved by implantation of boron ions.

* * * * *